United States Patent
Cutter et al.

(12) 
(10) Patent No.: US 6,351,424 B1
(45) Date of Patent: Feb. 26, 2002

(54) CANCELLATION OF REDUNDANT ELEMENTS WITH A CANCEL BANK

(75) Inventors: Douglas J. Cutter, Fort Collins, CO (US); Fan Ho, Sunnyvale, CA (US); Kurt D. Beigel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/634,069

(22) Filed: Aug. 8, 2000

(Under 37 CFR 1.47)

Related U.S. Application Data

(63) Continuation of application No. 09/225,811, filed on Jan. 5, 1999, now Pat. No. 6,128,240, which is a continuation of application No. 08/918,656, filed on Aug. 22, 1997, now Pat. No. 5,856,950.

(51) Int. Cl.⁷ ................................................ G11C 7/00
(52) U.S. Cl. ................ 365/225.7; 365/200; 365/230.02
(58) Field of Search .......................... 365/225.7, 230.02, 365/200, 189.02

(56) References Cited

U.S. PATENT DOCUMENTS

| | | | |
|---|---|---|---|
| 4,322,158 A | 3/1982 | Frias et al. | 355/27 |
| 5,264,725 A | 11/1993 | Mullarkey et al. | 257/665 |
| 5,548,553 A | 8/1996 | Cooper et al. | 365/200 |
| 5,557,848 A | 9/1996 | Povey | 29/890.143 |
| 5,642,316 A | 6/1997 | Tran et al. | 365/200 |
| 5,689,463 A | 11/1997 | Murakami et al. | 365/225.7 |
| 5,732,031 A | 3/1998 | Morgan | 365/200 |

*Primary Examiner*—Vu A. Le
(74) *Attorney, Agent, or Firm*—Schwegman, Lundberg, Woessner & Kluth, P.A.

(57) ABSTRACT

The cancellation of a redundant element of an integrated circuit with a cancel bank is disclosed. In one embodiment, a fuse or antifuse bank is coupled to the redundant element and permanently programmed to respond to the address of a defective primary element. If the redundant element is found to be defective, the fuse or antifuse bank is canceled, and a result the redundant element is also canceled. A cancel line of the fuse or antifuse bank, along with the cancel line of each of a plurality of other fuse or antifuse banks, is coupled to a cancel bank. The cancel bank comprises a multiplexer and a plurality of cancel antifuses less in number than the number of fuse or antifuse banks. The cancel antifuses are selectively enabled such that the fuse or antifuse bank coupled to the defective redundant element may be canceled.

59 Claims, 6 Drawing Sheets

CANCELLATION OF REDUNDANT ELEMENTS WITH A CANCEL BANK

This application is a Continuation of U.S. patent application Ser. No. 09/225,811, filed Jan. 5, 1999 now U.S. Pat. No. 6,128,240, which in turn is a Continuation of U.S. patent application Ser. No. 08/918,656, filed Aug. 22, 1997, now issued as U.S. Pat. No. 5,856,950.

FIELD OF THE INVENTION

The present invention relates generally to integrated circuits and more particularly to the cancellation of redundant elements in integrated circuits.

BACKGROUND OF THE INVENTION

As the number of electronic elements contained on semiconductor integrated circuits continues to increase, the problems of reducing and eliminating defects in the elements becomes more difficult. To achieve higher population capacities, circuit designs strive to reduce the size of the individual elements to maximize available die real estate. The reduced size, however, makes these elements increasingly susceptible to defects caused by material impurities during fabrication. These defects can be identified upon completion of the integrated circuit fabrication by testing procedures, either at the semiconductor chip level or after complete packaging. Scrapping or discarding defective circuits is economically undesirable, particularly if only a small number of elements are actually defective.

Relying on zero defects in the fabrication of integrated circuits is an unrealistic option, however. To reduce the amount of semiconductor scrap, therefore, redundant elements are provided on the circuit. If a primary element is determined to be defective, a redundant element can be substituted for the defective element. Substantial reductions in scrap can be achieved by using redundant elements.

One type of integrated circuit device which uses redundant elements is electronic memory. Typical memory circuits comprise millions of equivalent memory cells arranged in addressable rows and columns. By providing redundant elements, either as rows or columns, defective primary rows or columns can be replaced. Thus, using redundant elements reduces scrap without substantially increasing the cost of the memory circuit.

Because the individual primary elements of a memory are separately addressable, replacing a defective element typically comprises selecting a bank of switch circuits, each switch circuit typically being an antifuse or a fuse such that the bank is known as an antifuse bank or a fuse bank, respectively, to 'program' a redundant element to respond to the address of the defective element, and then enabling the redundant element by programming an enable antifuse. This process is very effective for permanently replacing defective primary elements. A problem with this process, however, is the possibility of replacing a defective primary element with a defective redundant element. The possibility of having a defective redundant element increases as the number of redundant elements on an integrated circuit increases. Because the process of replacing defective elements is a permanent solution, if a defective redundant element is used, the circuit must be scrapped.

The number of redundant elements provided on a circuit usually exceeds the number of redundant elements needed to 'repair' a defective chip. Therefore, it is desirable to replace the defective redundant element with another available redundant element. One manner by which to accomplish this is to include with the fuse or antifuse bank for each redundant element a cancel antifuse. If a redundant element proves to be defective, enabling the cancel antifuse effectively disables the fuse or antifuse bank, and therefore the redundant element. The fuse or antifuse bank for another redundant element can then be programmed to respond to the same address as the first redundant element to replace the defective primary element. However, this solution has a great drawback in that an additional antifuse is required for the fuse or antifuse bank of every redundant element, even though usually very few of the redundant elements are defective. Inclusion of a cancel antifuse for each redundant element is a poor use of die real estate.

For the reasons stated above, and for other reasons stated below which will become apparent to those skilled in the art upon reading and understanding the present specification, there is a need in the art for canceling and replacing defective redundant electronic elements on an integrated circuit without requiring a cancel antifuse for every redundant element.

SUMMARY OF THE INVENTION

The above-mentioned problems with repairing defective redundant elements and other problems are addressed by the present invention, which will be understood by reading and studying the following specification. The present invention relates to the cancellation of redundant elements with a cancel bank. A cancel bank circuit is described which provides for canceling defective redundant elements in an integrated circuit without requiring a cancel antifuse for every redundant element.

In particular, in one embodiment of the invention, a cancel bank circuit for an integrated circuit is operatively coupled to a plurality of switch banks and includes a plurality of cancel antifuses less in number than the number of switch banks. Each switch bank is operatively coupled to a redundant element. The cancel antifuses are selectively enabled to correspond to a particular switch bank (i.e., a particular redundant element). A multiplexer circuit operatively coupled to the antifuses and the switch banks permits cancellation of the particular switch bank addressed by the antifuses. Each switch bank is desirably an antifuse bank comprising a plurality of antifuses, or a fuse bank comprising a plurality of fuses.

In this manner, the present invention provides for the cancellation of a redundant element without requiring a cancel antifuse for every fuse or antifuse bank. Rather, a cancel bank, having a number of cancel antifuses less than the number of fuse or antifuse banks, permits cancellation of a fuse or antifuse bank, and thus the redundant element coupled thereto, by multiplexing the cancel antifuses to the fuse or antifuse banks. While this approach only permits one of the fuse or antifuse banks coupled to a given cancel bank to be canceled, it is rarely the case that more than one fuse or antifuse bank needs to be canceled.

Still other and further aspects, advantages and embodiments of the invention will become apparent by reading the following description and by reference to the drawings.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

A typical dynamic random-access memory (DRAM) is comprised of addressable memory cells arranged in rows and columns. The memory includes both primary rows and columns, or elements, as well as redundant rows and columns, or elements. One specific DRAM, the D54A series available from Micron Technology, Inc., of Boise, Id., includes 128 redundant rows. If a primary row or column is determined to be defective, it is known that a redundant row or column can be programmed to replace the defective row or column. This is accomplished by programming a redundant element to respond to the address of the defective primary element. Each of the redundant elements has a corresponding antifuse or fuse bank that is capable of receiving a multi-bit address signal in the form of a pre-coded signal. The antifuse or fuse bank is selectively programmable to respond to a specific address. Each antifuse or fuse bank evaluates the address signal and responds if the signal corresponds to the address of a defective primary element which is has been programmed to replace.

Figure 1:
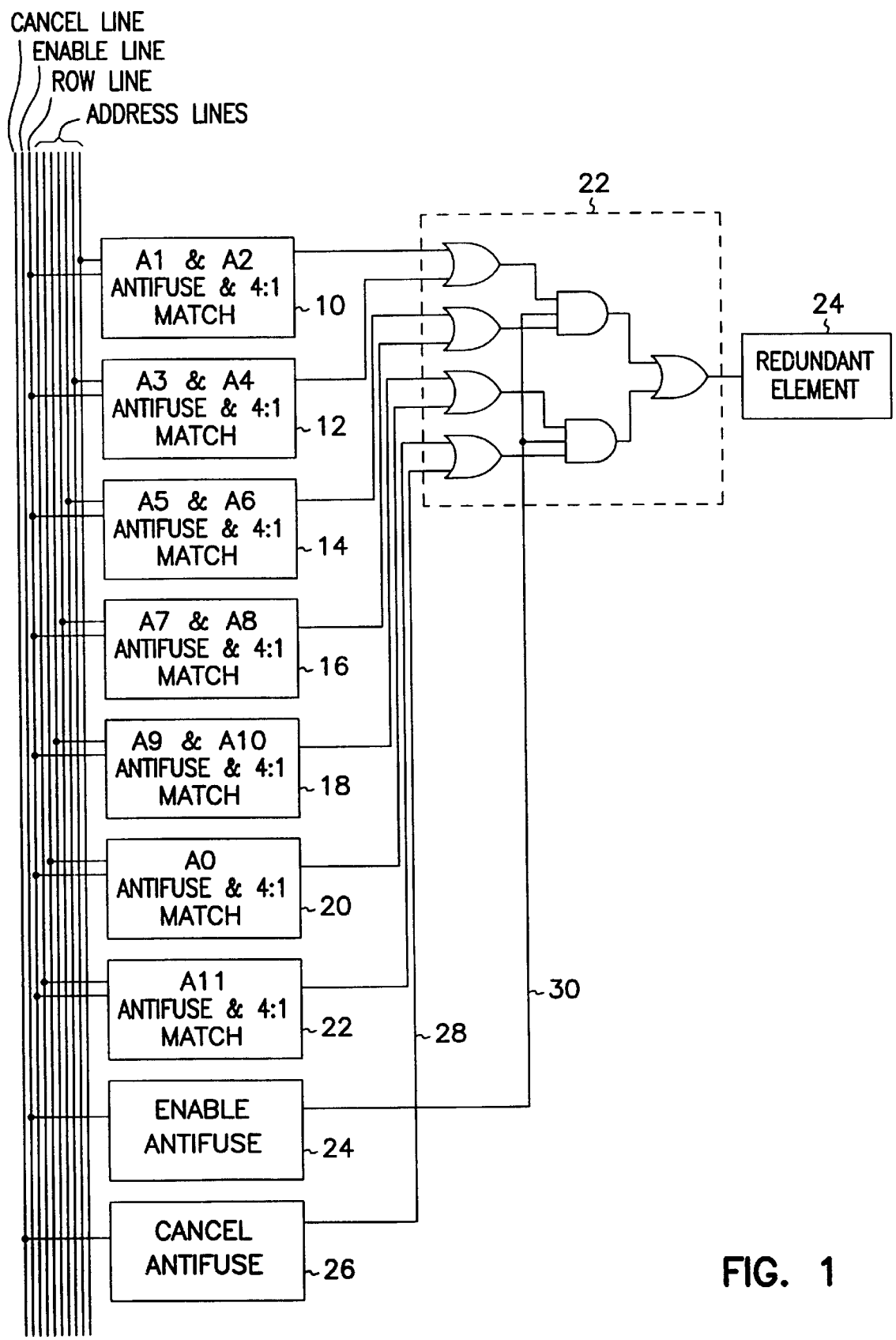
FIG. 1 is a diagram showing an antifuse bank for a dynamic random-access memory device, according to the prior art.

Referring to FIG. 1, a diagram of an antifuse bank for a DRAM according to the prior art is shown. The antifuse bank includes antifuse sub-banks 10, 12, 14, 16, 18, 20 and 21, as well as circuit 22, to which each of the sub-banks is coupled. The antifuse bank is associated with a particular redundant element of the DRAM. Each of antifuse sub-banks 10, 12, 14, 16, and 18 has four antifuses, which as shown is represented by the terminology "4:1 match." Each of antifuse sub-banks 20 and 21 has two antifuses, which as shown is represented by the terminology "2:1 match." Each of the antifuse banks is coupled to the row lines (0:11), and as indicated to one or two of the address lines, which from left to right are A11 (0:1), A0 (0:1), A9 and A10 (0:3), A7 and A8 (0:3), A5 and A6 (0:3), A3 and A4 (0:3), and A1 and A2 (0:3). The antifuses of the antifuse sub-banks are selectively selected to program the antifuse bank to respond to the address of a defective primary element. If an address received on the address lines matches the programmed address, the antifuse bank via circuit 22 accesses redundant element 24, to which it is coupled.

In operation, enable antifuse 26 is activated so that enable line 28 is permanently held low, as understood by those skilled in the art. The selecting of antifuses in the antifuse bank, and the activation of enable antifuse 26, are permanent alterations to the DRAM of which the antifuse bank of FIG. 1 is a part. Should redundant element 24, which is meant to replace a defective primary element, also prove to be defective, the antifuses cannot be unselected, nor the enable-antifuse deactivated. Rather, in such situation cancel antifuse 30 is activated so that cancel line 32 is permanently held low. This cancels the antifuse bank; that is, the antifuse bank does not respond to the address programmed in the antifuses of the antifuse bank. However, inclusion of cancel antifuse 30 is less than desirable. As those of ordinary skill in the art know, antifuses typically require a relatively large amount of area on the die. Cancel antifuse 30 thus uses valuable real estate on the die, but is used only in the extraordinary situation in which redundant element 24 is defective. Furthermore, in the case where there are 128 redundant elements on a DRAM, there must also be 128 antifuse banks, one for each redundant elements, and therefore 128 cancel antifuses, few of which are typically activated.

Figure 2:
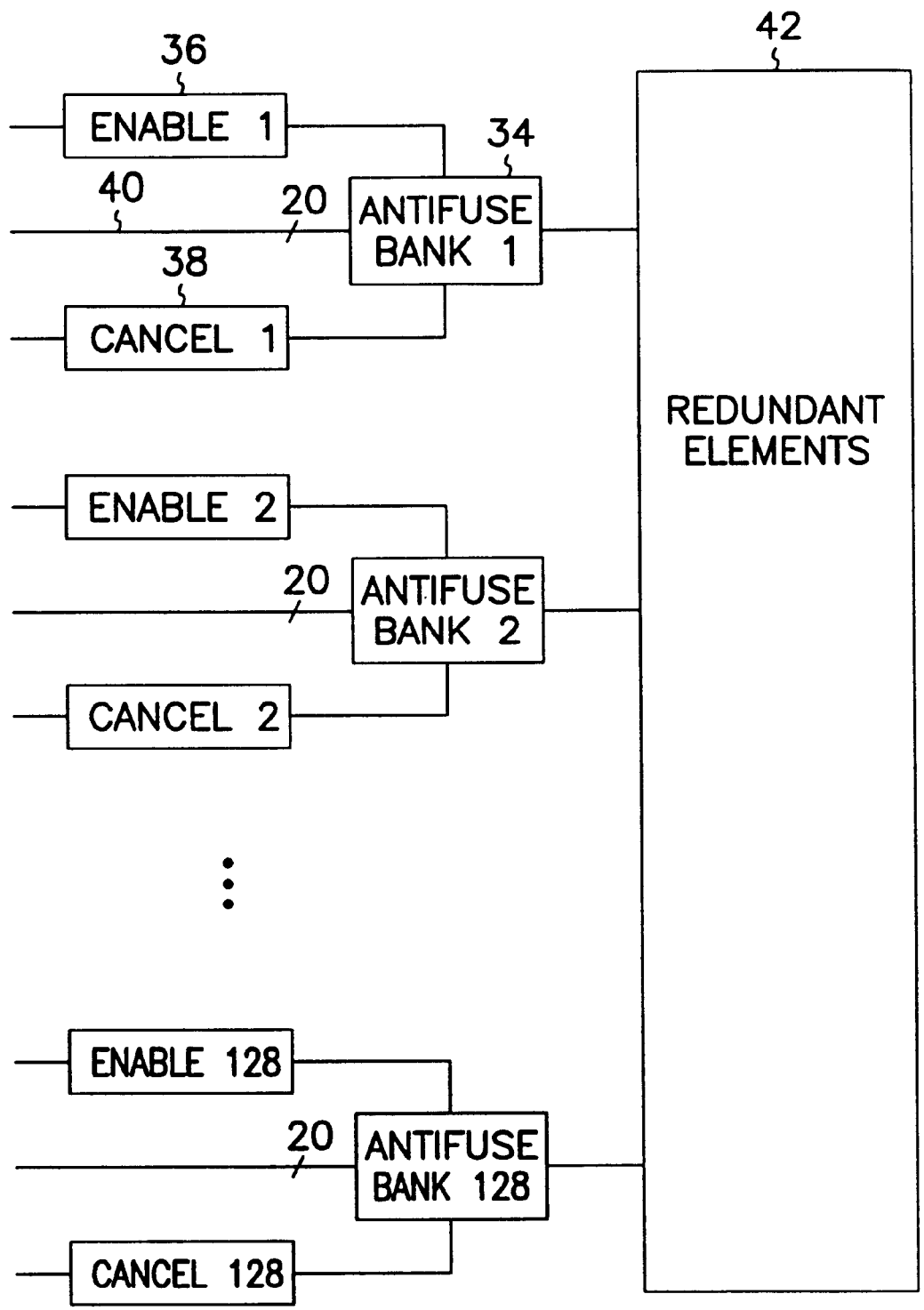
FIG. 2 is a block diagram showing all 128 antifuse banks of a DRAM, according to the prior art.

This situation is shown more clearly in FIG. 2, which is a block diagram of 128 antifuse banks of a DRAM, according to the prior art. Each antifuse bank 34 is operatively coupled to an enable antifuse 36 and a cancel antifuse 28. Each antifuse bank 34 also has address lines 40 running thereto, and is coupled to one of redundant elements 42. The antifuse banks of FIG. 2 include 128 cancel antifuses. According to the prior art, a cancel antifuse is required for each antifuse bank in the DRAM, so that if the redundant element to which the antifuse bank is coupled is found to be defective, the cancel antifuse can be activated to cancel the antifuse bank, and the associated redundant element as well.

Figure 3:
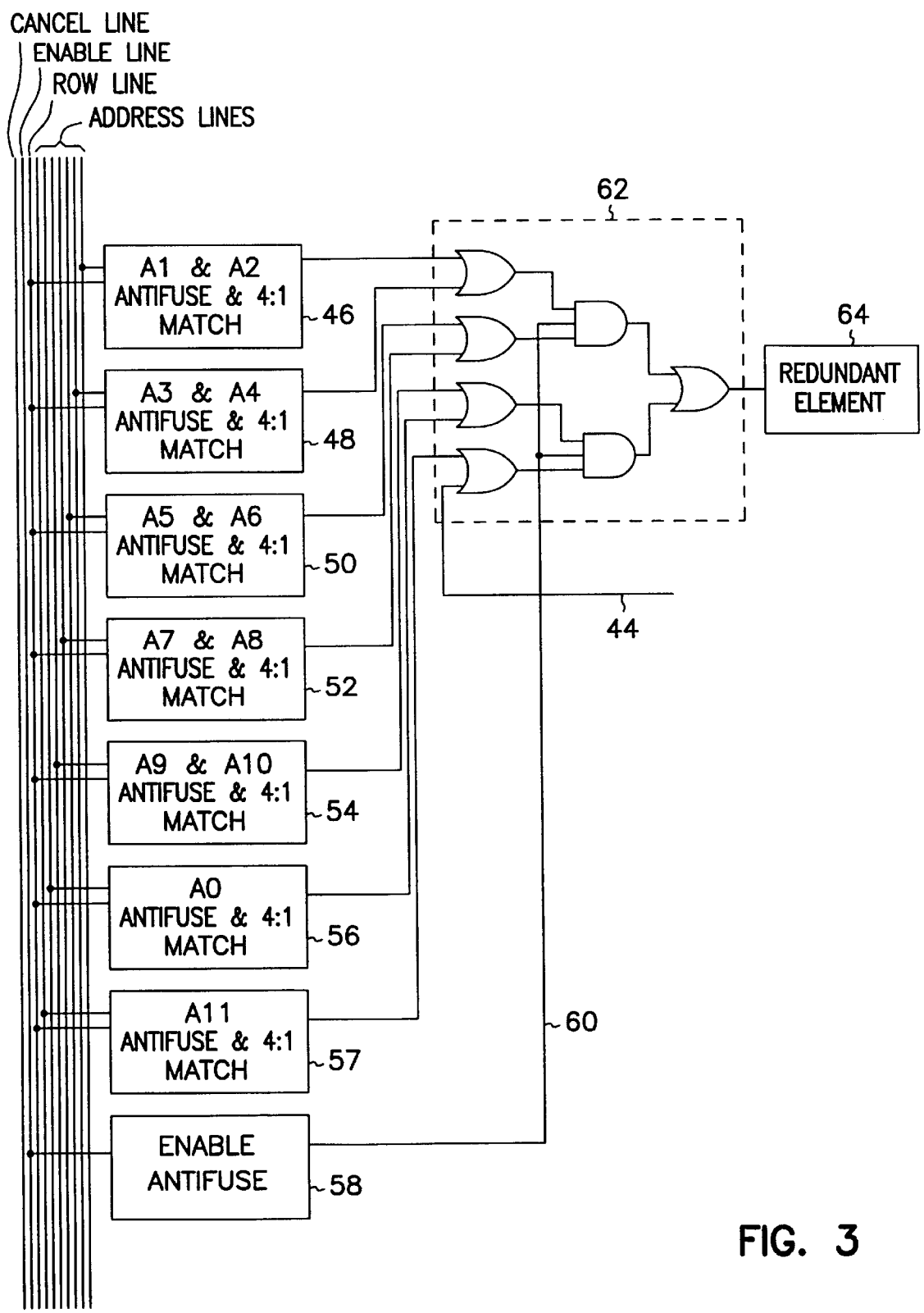
FIG. 3 is a diagram showing an antifuse bank according to an embodiment of the present invention.

Referring now to FIG. 3, an antifuse bank according to one embodiment of the present invention is shown. The antifuse bank of FIG. 3 is identical to that shown in FIG. 1, except that the antifuse bank does not include a cancel antifuse (e.g., cancel antifuse 30 of FIG. 1). That is, cancel line 44 of the antifuse bank of FIG. 3 does not have running in-line a cancel antifuse. Otherwise, the antifuse bank of the FIG. 3 operates the same as has been discussed in conjunction with the antifuse bank of FIG. 1, and reference should be made to that discussion for further understanding thereto. The antifuses of antifuse sub-banks 46, 48, 50, 52, 54, 56 and 57 are selectively selected to program an address corresponding to the address of a defective element of memory cells, and enable antifuse 58 is activated such that enable line 60 is permanently held low. When the address on the address lines matches the address programmed in the antifuses, circuit 62 permits the antifuse bank to access redundant element 64, to which it is coupled. Note that the present invention is not limited to an antifuse bank having any particular number of antifuse sub-banks or any particular number of antifuses.

If redundant element 64 of FIG. 3 is defective, however, cancel line 44 must still be permanently held low, no different than cancel line 32 of FIG. 1 having to be held low in the case where redundant element 24 of FIG. 1 is defective. The difference is that the invention does not require a dedicated cancel antifuse for the antifuse bank (i.e., such as antifuse 30 of FIG. 1). To provide that the cancel line of an antifuse bank is permanently held low in the situation where the redundant element coupled to the antifuse bank is defective and thus must be canceled, the present invention provides instead for a cancel bank.

Figure 4:
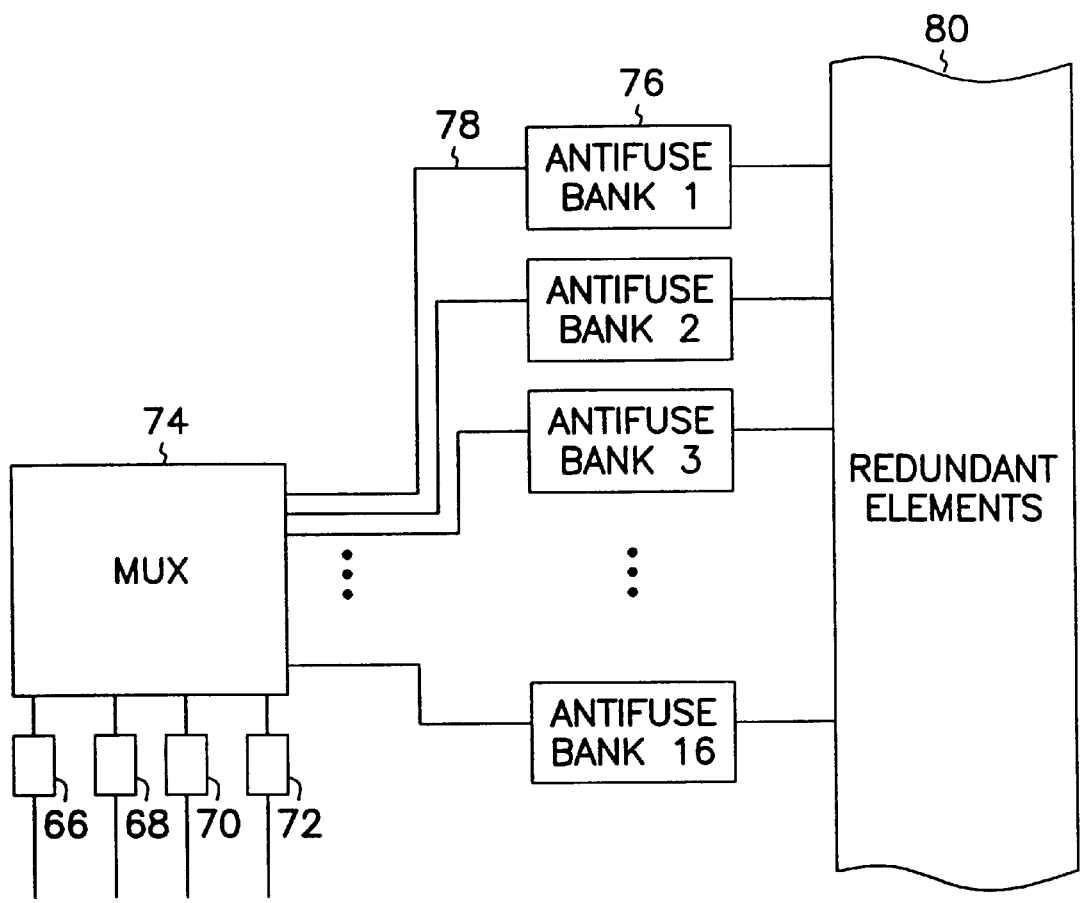
FIG. 4 is a diagram showing a cancel bank coupled to sixteen antifuse banks, according to an embodiment of the present invention.

This is shown in FIG. 4, which is a diagram of sixteen antifuse banks of an integrated circuit coupled to a cancel bank, according to one embodiment of the present invention.

The cancel bank comprises cancel antifuses 66, 68, 70 and 72, and also multiplexer 74. Each antifuse bank 76 (of a total of sixteen antifuse banks) includes a cancel line 78 operatively coupled to multiplexer 74. Each antifuse bank 76 is also coupled to one of redundant elements 80. Note that for purposes of clarity, the enable antifuse and address line for each antifuse bank 76 are not shown in FIG. 4.

Cancel antifuses 66, 68, 70 and 72 are selectively activated to permanently hold low cancel line 78 of one antifuse bank 76. That is, as those of ordinary skill in the art will readily understand, cancel antifuses 66, 68, 70 and 72 are the selection inputs to multiplexer 74. By selectively activating the cancel antifuses, the multiplexer selects the cancel line of one of the antifuse banks to be permanently held low. The present invention is not limited to any particular implementation of multiplexer 74. Because there are four cancel antifuses, the multiplexer can permanently select the cancel line of one of $2^4$, or sixteen, antifuse banks.

The resulting savings in die area of the antifuse banks of the present invention as shown in FIG. 4 is immerse as compared to comparable prior art antifuse banks. Sixteen prior art antifuse banks would each require a separate cancel antifuse, for a total of sixteen cancel antifuses, while the sixteen antifuse banks shown in FIG. 4 only require four cancel antifuses. The present invention, therefore, provides for a 75% reduction in the number of cancel antifuses required for antifuse banks.

Those of ordinary skill in the art will recognize that the present invention is not limited to any particular type of antifuse for the antifuse banks, nor any particular type of antifuse for the cancel antifuse and the enable antifuse. In one embodiment of the invention, the antifuses are fabricated with a structure similar to that of a capacitor, such that two conductive electrical terminals are separated by a dielectric layer. In the unprogrammed "off" state, in which the antifuse is fabricated, there is a high resistance between the terminals, while in the programmed "on" state, there is low resistance. To program an antifuse "on," a large programming voltage is applied across the antifuse terminals, breaking down the interposed dielectric and forming a conductive link between the antifuse terminals.

Figure 5:
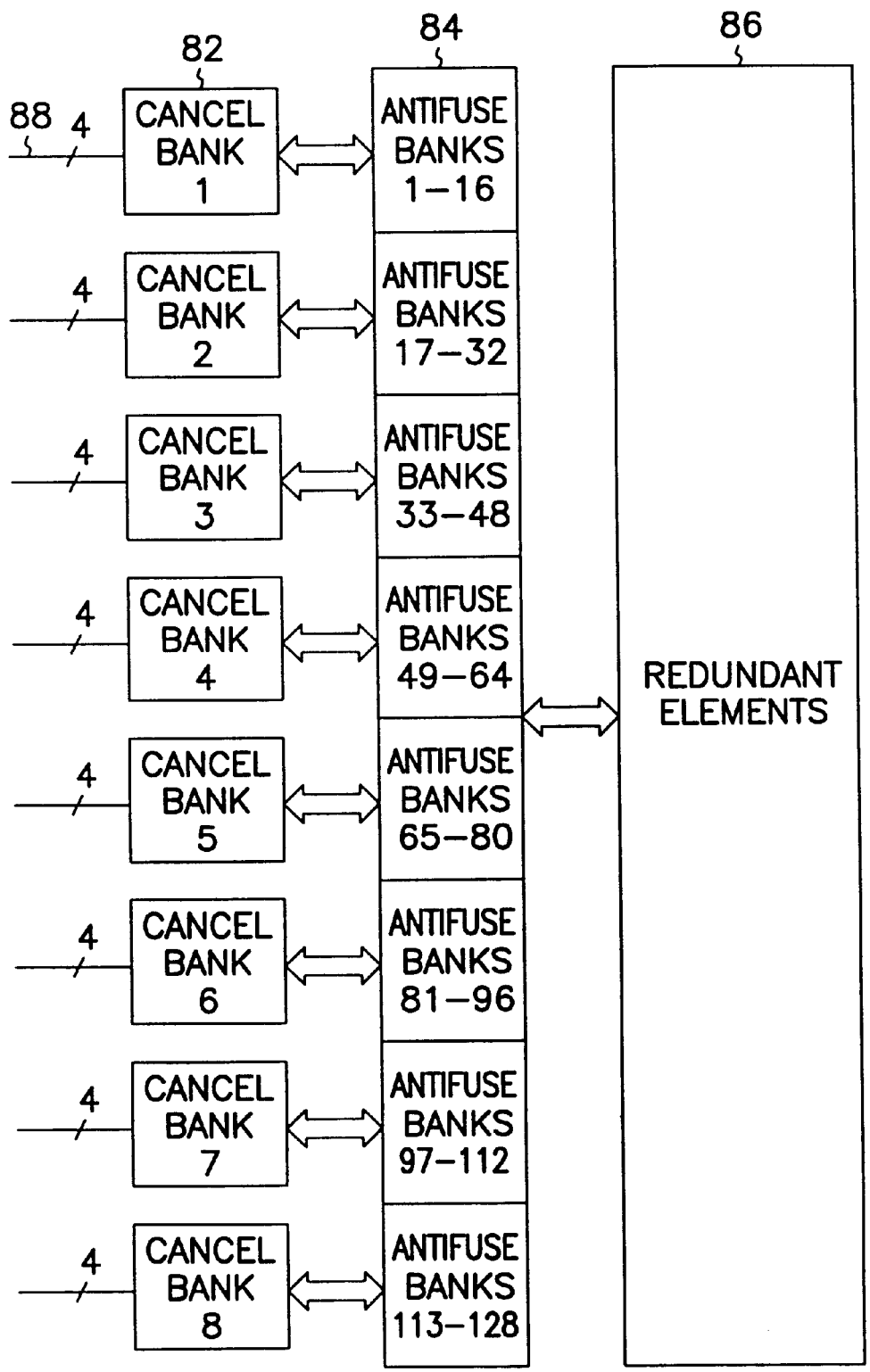
FIG. 5 is a block diagram showing all 128 antifuse banks of a DRAM, according to an embodiment of the present invention; and, FIG. 6 is a flowchart of a method according to one embodiment of the present invention.

Referring now to FIG. 5, a diagram showing 128 antifuse banks of a DRAM according to an embodiment of the present invention is shown. Each cancel bank 82, of a total of eight such cancel banks, is operatively coupled to sixteen antifuse banks 84, for a total of 128 antifuse banks. The antifuse banks are all operatively coupled to redundant elements 86. Each cancel bank 82 includes a multiplexer and four cancel antifuses. Thus, each cancel bank 82 has four incoming cancel select lines 88. Each cancel bank 82 is capable of canceling one of the sixteen antifuse banks to which it is coupled, and as result, one of the redundant elements as well. There are a total of 8×4, or 32, cancel antifuses in the DRAM shown in FIG. 5. This is a reduction of 96 antifuses as compared to the prior art DRAM of FIG. 2, and represents a considerable savings in die area.

Figure 6:
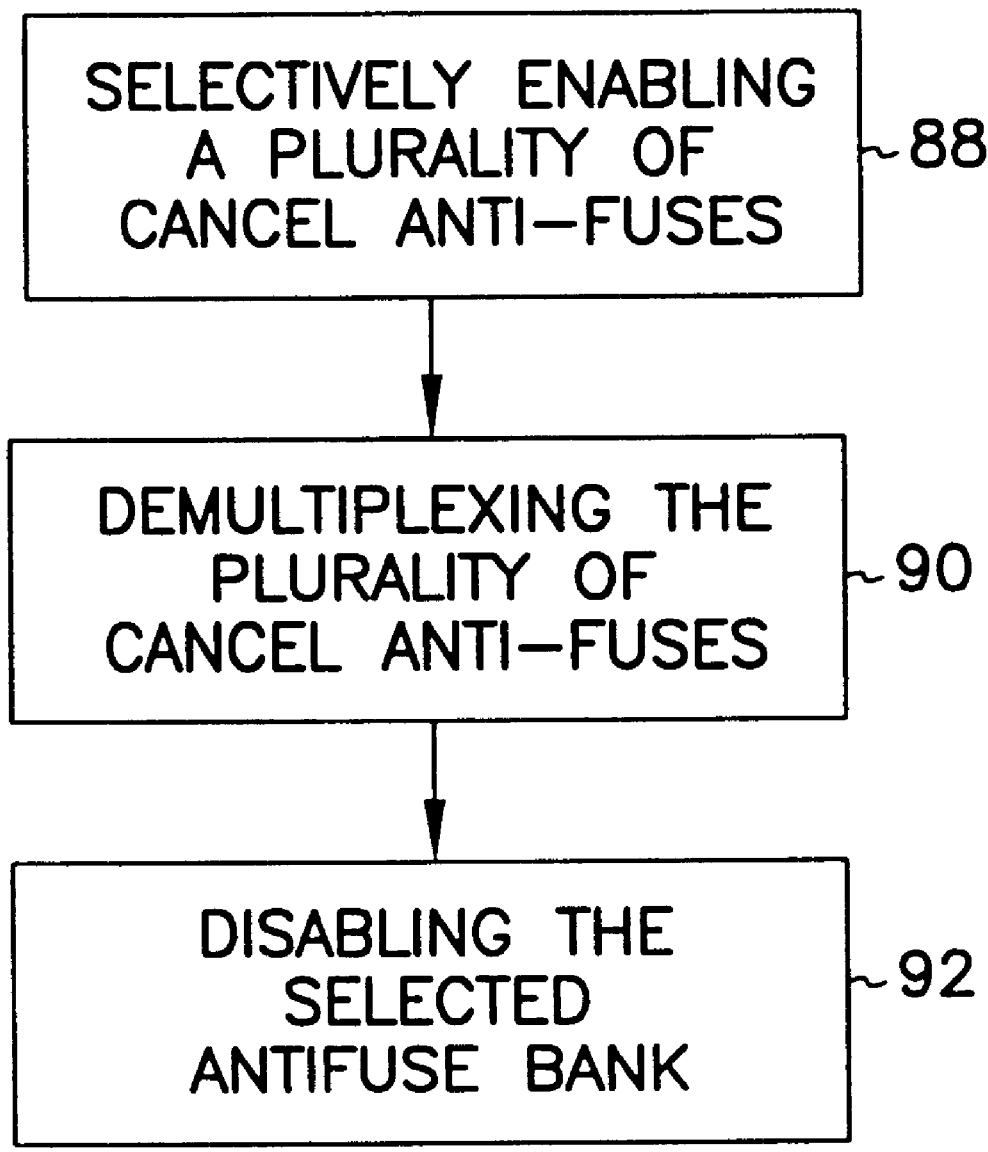

Referring now to FIG. 6, a flowchart of a method according to an embodiment of the present invention is shown. This method is for canceling an antifuse bank of an integrated circuit such as a memory device. By canceling the antifuse bank, any redundant memory cell that may be coupled to the antifuse bank is also canceled. As has been discussed, this is useful in the context where the redundant memory cell is defective, but the antifuse bank has already been programmed to a particular address. Because the programming of an antifuse bank is permanent and cannot be undone, unless the antifuse bank can be canceled, the circuit on which the antifuse bank resides must be discarded.

In step 88 of the method, a plurality of cancel antifuses is selectively enabled to correspond to the antifuse bank. That is, the plurality of cancel antifuses corresponds to the selection inputs of a multiplexer coupled to the cancel lines of each antifuse bank, and therefore the plurality of cancel antifuses must be selectively enabled so that the antifuse bank to be canceled is properly chosen. In one embodiment, as has been discussed, an antifuse is selected by the assertion of a high current to the antifuse, so that the dielectric plates of the antifuse are joined together to form a conductive path of low resistance.

In step 90 of the method, the plurality of cancel antifuses are demultiplexed. This is accomplished by the multiplexer, which decodes the address on the multiplexer selection inputs (i.e., the cancel antifuses) to select one of the cancel lines of the antifuse bank. As those of ordinary skill within the art recognize, the number of cancel antifuses is less than the number of antifuse banks. This necessarily results from use of a multiplexer. Finally, in step 92 of the method, the selected antifuse bank is disabled, which also disables the redundant element to which the antifuse bank may be coupled. This is accomplished in one embodiment by holding permanently the cancel line of the selected antifuse bank to a low voltage. This overrides the enablement of the antifuse bank via any enable antifuse, and therefore permits another antifuse bank to be programmed to the same address, to attempt again the replacement of a defective element.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the invention has been shown in relation to a DRAM. However, any integrated circuit in which a redundant element can be canceled according to the invention can be implemented is amenable to the invention. In one embodiment, the integrated circuits are dynamic random-access-memories (DRAMs). In other embodiments, the integrated circuits are static random-access-memories (SRAMs), flash memories, synchronous dynamic random-access-memories (SDRAMs), extended-data-out random-access-memories (EDO RAMs), and bust-extended-data-out random-access-memories (BEDO RAMs), as those skilled in the art will appreciate.

For further example, embodiments have been illustrated in the context of antifuse banks, which include antifuse sub-banks of a number of antifuses each. However, an antifuse is only one such switch mechanism that may be used by embodiments of the invention; for example, a fuse, such that fuse banks including fuse sub-banks of a number of fuses each, may also be used. Therefore, it is manifestly intended that this invention be limited only by the following claims and equivalents thereof.

What is claimed is:

1. A device, comprising:
    a selection circuit with a number of selection outputs and a number of selection inputs less than the number of selection outputs, wherein each selection output is operably coupled to a switch bank; and
    a set of cancel switches coupled to the selection inputs of the selection circuit for permanently producing a cancel signal on one of the selection outputs, wherein the cancel signal disables a selected switch bank such that the selected switch bank does not replace a defective primary element with a defective redundant element.

2. The device of claim 1, wherein the set of cancel switches includes n cancel switches, and the number of selection outputs operably coupled to a switch bank includes $2^n$ selection outputs.

3. The device of claim 1, wherein the set of cancel switches includes four cancel switches, and the number of selection outputs operably coupled to a switch bank includes sixteen switch banks.

4. The device of claim 1, wherein the set of cancel switches includes a set of antifuses.

5. The device of claim 1, wherein the set of cancel switches includes a set of fuses.

6. A device, comprising:
    a selection circuit with a number of selection outputs and a number of selection inputs less than the number of selection inputs;
    at least one cancel switch coupled to the selection inputs; and
    a plurality of switch banks, each switch bank being coupled to one of the selection outputs;
    wherein a programmed at least one cancel switch is capable of producing a cancel signal on one of the selection outputs to disable a selected switch bank such that the selected switch bank does not replace a defective primary element with a defective redundant element.

7. The device of claim 6, wherein the at least one cancel switch includes n cancel switches, and the plurality of switch banks includes $2^n$ switch banks.

8. The device of claim 6, wherein the at least one cancel switch includes four cancel switches, and the plurality of switch banks includes sixteen switch banks.

9. The device of claim 6, wherein each cancel switch includes an antifuse.

10. The device of claim 6, wherein each cancel switch includes a fuse.

11. The device of claim 6, wherein each switch bank includes an antifuse such that each switch bank is an antifuse bank.

12. The device of claim 6, wherein each switch bank includes a fuse such that each switch bank is a fuse bank.

13. A device, comprising:
    a cancel bank, including:
        a decoder with a number of selection outputs and a number of selection inputs less than the number of selection outputs; and
        a set of selection switches, wherein the number of selection switches corresponds to the number of selection inputs such that one selection switch is coupled to one selection input;
    a number of switch banks corresponding to the number of selection outputs such that one selection output is coupled to one switch bank; and
    a number of redundant elements, wherein each switch bank corresponds to a predetermined redundant element and is capable of replacing a defective primary element with the predetermined redundant element, and wherein the set of selection switches is capable of producing a cancel signal on one of the selection outputs to disable a selected switch bank such that the selected switch bank does not replace a defective primary element with a defective redundant element.

14. The device of claim 13, wherein the set of selection switches includes n selection switches, and the number of switch banks includes $2^n$ switch banks.

15. The device of claim 13, wherein each selection switch includes an antifuse.

16. The device of claim 13, wherein each selection switch includes a fuse.

17. The device of claim 13, wherein each switch bank includes an antifuse such that each switch bank is an antifuse bank.

18. The device of claim 13, wherein each switch bank includes a fuse such that each switch bank is a fuse bank.

19. The device of claim 13, wherein the decoder is a multiplexer for demultiplexing a signal received at the selection inputs into a cancel signal for a selected one of the switch banks.

20. An integrated circuit, comprising:
    a selection circuit with a number of selection outputs and a number of selection inputs fewer than the number of outputs;
    switch banks, wherein:
        each switch bank is permanently programmable;
        each switch bank is adapted for replacing a defective primary element with a predetermined redundant element; and
        the number of switch banks corresponds to the number of selection outputs such that one switch bank is coupled to one selection output;
    a number of cancel switches coupled to the selection inputs of the selection circuit for permanently producing a cancel signal on one of the selection outputs of the selection circuit such that the cancel signal disables a selected switch bank from replacing a defective primary element with a defective redundant element.

21. The integrated circuit of claim 20, wherein the number of cancel switches includes n cancel switches, and the number of switch banks includes $2^n$ switch banks.

22. The integrated circuit of claim 20, wherein each cancel switch includes an antifuse.

23. The integrated circuit of claim 20, wherein each cancel switch includes a fuse.

24. The integrated circuit of claim 20, wherein each switch bank includes an antifuse such that each switch bank is an antifuse bank.

25. The integrated circuit of claim 20, wherein each switch bank includes a fuse such that each switch bank is a fuse bank.

26. The integrated circuit of claim 20, wherein the selection circuit is a mulitplexer for demultiplexing a signal received at the selection inputs into a cancel signal for a selected one of the switch banks.

27. An integrated circuit, comprising:
    a number of switch banks, wherein each switch bank is permanently programmable and is adapted for replacing a defective primary element with a predetermined redundant element;
    a number of cancel banks, wherein the number of cancel banks is less than the number of switch banks, and wherein each cancel bank includes:
        a selection circuit with a number of selection outputs and a number of selection inputs, wherein each selection output is coupled to one of the switch banks;
        a number of cancel switches coupled to the selection inputs of the selection circuit for permanently producing a cancel signal on one of the selection outputs of the selection circuit such that the cancel signal disables a selected switch bank from replacing a defective primary element with a defective redundant element, wherein the number of cancel switches is less than the number of switch banks.

28. The integrated circuit of claim 27, wherein the number of cancel switches includes n cancel switches, and the number of switch banks includes $2^n$ switch banks.

29. The integrated circuit of claim 27, wherein each cancel switch includes an antifuse.

30. The integrated circuit of claim 27, wherein each cancel switch includes a fuse.

31. The integrated circuit of claim 27, wherein each switch bank includes an antifuse such that each switch bank is an antifuse bank.

32. The integrated circuit of claim 27, wherein each switch bank includes a fuse such that each switch bank is a fuse bank.

33. The integrated circuit of claim 27, wherein the selection circuit is a multiplexer for demultiplexing a signal received at the selection inputs into a cancel signal for a selected one of the switch banks.

34. An integrated circuit, comprising:
a selection circuit with a number of selection outputs and a number of selection inputs;
a set of switch banks for replacing a defective primary element with a predetermined redundant elements, each switch bank being coupled to one of the outputs of the selection circuit, each switch bank including:
a logic circuit coupled to the predetermined redundant element;
one or more permanently programmable switch subbanks coupled to at least one address line for responding to a defective primary element address; and
a permanently programmable enable switch for enabling the logic circuit; and
a set of permanently programmable cancel switches coupled to the selection inputs of the selection circuit for producing a cancel signal on one of the selection outputs of the selection circuit such that the cancel signal disables a selected switch bank from replacing a defective primary element with a defective redundant element, wherein the number of cancel switches is less than the number of switch banks.

35. The integrated circuit of claim 34, further including:
a plurality of redundant elements;
a plurality of primary elements, each having a primary element address;
an enable line coupled to the enable switch; and
address lines for programming a selected one of the switch banks to respond to the defective primary element address for the defective primary element by replacing the defective primary element with the predetermined redundant element.

36. The integrated circuit of claim 34, wherein the number of cancel switches includes n cancel switches, and the number of switch banks includes $2^n$ switch banks.

37. The integrated circuit of claim 34, wherein each cancel switch includes an antifuse.

38. The integrated circuit of claim 34, wherein each cancel switch includes a fuse.

39. The integrated circuit of claim 34, wherein each switch bank includes an antifuse such that each switch bank is an antifuse bank.

40. The integrated circuit of claim 34, wherein each switch bank includes a fuse such that each switch bank is a fuse bank.

41. The integrated circuit of claim 34, wherein the selection circuit is a multiplexer for demultiplexing a signal received at the selection inputs into a cancel signal for a selected one of the switch banks.

42. An integrated circuit, comprising:
a cancel bank, including:
a selection circuit with a number of selection outputs and a number of selection inputs; and
a set of selection switches coupled to the selection inputs of the selection circuit for permanently producing a cancel signal on one of the selection outputs;
a set of switch banks for replacing a defective primary element with a predetermined redundant element, wherein the number of selection switches is less than the number of switch banks, and wherein each switch bank includes:
a logic circuit coupled to the predetermined redundant element;
one or more permanently programmable switch subbands coupled to at least one address line for responding to a defective primary element address;
an enable switch for permanently enabling the logic circuit; and
a cancel line coupled between the logic circuit and one of the selection outputs of the selection circuit.

43. The integrated circuit of claim 42, further including:
a plurality of redundant elements;
a plurality of primary elements, each having a primary element address;
an enable line coupled to the enable switch; and
address lines for programming a selected one of the switch banks to respond to the defective primary element address for the defective primary element by replacing the defective primary element with the predetermined redundant element.

44. The integrated circuit of claim 42, wherein the number of selection switches includes n cancel switches, and the number of switch banks includes $2^n$ switch banks.

45. The integrated circuit of claim 42, wherein each selection switch includes an antifuse.

46. The integrated circuit of claim 42, wherein each selection switch includes a fuse.

47. The integrated circuit of claim 42, wherein each switch bank includes an antifuse such that each switch bank is an antifuse bank.

48. The integrated circuit of claim 42, wherein each switch bank includes a fuse such that each switch bank is a fuse bank.

49. The integrated circuit of claim 42, wherein the selection circuit is a multiplexer for demultiplexing a signal received at the selection inputs into a cancel signal for a selected one of the switch banks.

50. An integrated circuit, comprising:
a plurality of redundant elements for replacing defective primary elements;
a plurality of switch banks organized in switch bank sets, each switch bank adapted for being permanently programmed to replace a defective primary element with a predetermined redundant element; and
a plurality of cancel banks for disabling a switch bank such that the switch bank does not replace a defective primary element with a defective redundant element, wherein each cancel bank is coupled to a switch bank set and to a number of cancel select lines, wherein the number of cancel select lines is less than the number of switch banks in each switch bank set, and wherein each cancel bank is coupled to n cancel select lines, and each switch bank set includes $2^n$ switch banks.

51. An integrated bank, comprising:

a plurality of redundant elements for replacing defective primary elements;

a plurality of switch banks organized in switch bank sets, each switch bank adapted for being permanently programmed to replace a defective primary element with a predetermined redundant element; and a plurality of cancel banks for disabling a switch bank such that the switch bank does not replace a defective primary element with a defective redundant element, wherein each cancel bank is coupled to a switch bank set and to a number of cancel select lines, wherein the number of cancel select lines is less than the number of switch banks in each switch bank set, and wherein each cancel bank is coupled to four cancel select lines, and each switch bank set includes sixteen switch banks.

52. An integrated circuit, comprising:

a plurality of redundant elements for replacing defective primary elements;

a plurality of switch banks organized in switch bank sets, each switch bank adapted for being permanently programmed to replace a defective primary element with a predetermined redundant element; and a plurality of cancel banks for disabling a switch bank such that the switch bank does not replace a defective primary element with a defective redundant element, wherein each cancel bank is coupled to a switch bank set and to a number of cancel select lines, wherein the number of cancel select lines is less than the number of switch banks in each switch bank set, and wherein each cancel bank includes:

a selection circuit with a number of selection outputs and a number of selection inputs; and a set of selection switches coupled between the number of cancel select lines and the selection inputs of the selection circuit, each of the selection switches being permanently programmable to produce a cancel signal on one of the selection outputs.

53. An integrated circuit, comprising:

a plurality of redundant elements for replacing defective primary elements;

a plurality of switch banks organized in switch bank sets, each switch bank adapted for being permanently programmed to replace a defective primary element with a predetermined redundant element; and a plurality of cancel banks for disabling a switch bank such that the switch bank does not replace a defective primary element with a defective redundant element, wherein each cancel bank is coupled to a switch bank set and to a number of cancel select lines, and wherein the number of cancel select lines is less than the number of switch banks in each switch bank set, wherein each switch bank includes:

a logic circuit coupled to the predetermined redundant element and to one of the cancel banks;

one or more permanently programmable switch sub-banks coupled to the logic circuit and to at least one address line for responding to a defective primary element address; and a permanently programmable enable switch for enabling the logic circuit.

54. A method for canceling a programmed switch bank that has replaced a defective primary element with a defective redundant element, comprising:

providing a coded cancel signal, wherein providing a coded cancel signal includes selectively actuating at least one cancel switch in a set of cancel switches to provide the coded cancel signal; and decoding the coded cancel signal to disable a selected programmed switch bank that has replaced a defective primary element with a defective redundant element.

55. A method for canceling a programmed switch bank that has replaced a defective primary element with a defective redundant element, comprising:

providing a coded cancel signal, wherein providing a coded cancel signal includes selectively applying a high current to at least one cancel switch in a set of cancel switches; and decoding the coded cancel signal to disable a selected programmed switch bank that has replaced a defective primary element with a defective redundant element.

56. A method for canceling a programmed switch bank that has replaced a defective primary element with a defective redundant element, comprising:

providing a coded cancel signal, wherein providing a coded cancel signal includes selectively actuating at least one cancel switch in a set of n cancel switches; and decoding the coded cancel signal to disable a selected programmed switch bank that has replaced a defective primary element with a defective redundant element, wherein decoding the coded cancel signal to disable a selected programmed switch bank includes decoding the coded cancel signal into one of $2^n$ cancel signals to disable one of a set of $2^n$ switch banks.

57. A method of forming an integrated circuit, comprising:

providing a plurality of primary elements;

providing a plurality of redundant elements;

providing a plurality of switch banks organized in switch bank sets, wherein each switch bank is adapted for replacing a defective primary element with a predetermined redundant element; and providing a plurality of cancel banks, wherein each cancel bank corresponds to a switch bank set and is adapted for providing a cancel signal to disable a selected switch bank in each switch bank set from replacing a defective primary element with a defective redundant element.

58. The method of claim 57, wherein providing a plurality of cancel banks includes providing n cancel switches in each cancel bank for every $2^n$ switch banks in each switch bank set.

59. The method of claim 57, wherein providing a plurality of cancel banks includes:

providing a decoder with a number of selection outputs and an number of selection inputs less than the number of selection outputs; and providing a number of permanently programmable selection switches that correspond to the number of selection inputs such that one selection switch is coupled to one selection input.

* * * * *

UNITED STATES PATENT AND TRADEMARK OFFICE
CERTIFICATE OF CORRECTION

PATENT NO.    : 6,351,424 B1
DATED         : February 26, 2002
INVENTOR(S)   : Cutter et al.

It is certified that error appears in the above-identified patent and that said Letters Patent is hereby corrected as shown below:

Column 5,
Line 20, delete "immerse" and insert -- immense --, therefor.

Column 11,
Line 1, delete "bank" and insert -- circuit --, therefor.

Column 12,
Line 56, delete "an" and insert -- a --, therefor.

Signed and Sealed this

Second Day of July, 2002

*Attest:*

*Attesting Officer*

JAMES E. ROGAN
*Director of the United States Patent and Trademark Office*